US011231999B2

United States Patent
Halladay et al.

(10) Patent No.: US 11,231,999 B2
(45) Date of Patent: Jan. 25, 2022

(54) DETECTION OF ELECTRIC POWER SYSTEM ANOMALIES IN STREAMING MEASUREMENTS

(71) Applicant: Schweitzer Engineering Laboratories, Inc., Pullman, WA (US)

(72) Inventors: Matthew Jacob Halladay, Moscow, ID (US); Ellery Abner Blood, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 787 days.

(21) Appl. No.: 15/214,922

(22) Filed: Jul. 20, 2016

(65) Prior Publication Data

US 2018/0024203 A1    Jan. 25, 2018

(51) Int. Cl.
*G01R 31/40* (2020.01)
*G06F 11/14* (2006.01)
*H03K 5/26* (2006.01)

(52) U.S. Cl.
CPC ........... *G06F 11/1441* (2013.01); *H03K 5/26* (2013.01)

(58) Field of Classification Search
CPC ....... G01R 31/40; H03K 5/26; G06F 11/1441; G06F 2201/805
See application file for complete search history.

(56) References Cited

U.S. PATENT DOCUMENTS

| 2012/0051579 A1* | 3/2012 | Cohen | A61H 23/0236 |
| | | | 381/388 |
| 2013/0173218 A1* | 7/2013 | Maeda | G05B 23/0221 |
| | | | 702/182 |

(Continued)

OTHER PUBLICATIONS

Sancho, J., et al. "Evaluation of Harmonic Variability in Electrical Power Systems through Statistical Control of Quality and Functional Data Analysis." The Manufacturing Engineering Society International Conference, MESIC 2013, 2013. (Year: 2013).*

(Continued)

*Primary Examiner* — Regis J Betsch
*Assistant Examiner* — Jeremy A Delozier
(74) *Attorney, Agent, or Firm* — Jared L. Cherry; Bradley W. Schield; Fletcher Yoder, P.C.

(57) ABSTRACT

The present disclosure pertains to detection of anomalous conditions in a variety of types of systems. In one embodiment, a system may be configured to identify anomalous conditions in a stream of measurements. The system may include a communications interface configured to receive a stream of measurements. An archive subsystem may maintain a data archive comprising a statistical representation of the stream of measurements. A pre-processing subsystem may divide the stream of measurements into a plurality of data windows. The plurality of data windows may be analyzed by an analysis subsystem configured to generate a plurality of normalized representations based on the data archive. The plurality of normalized representations may be grouped into a plurality of ranges. An anomaly detection subsystem may perform a comparison of the plurality of normalized representations to at least one threshold and may determine that the comparison indicates an anomalous condition.

20 Claims, 5 Drawing Sheets

(56) References Cited

U.S. PATENT DOCUMENTS

2014/0198405 A1* 7/2014 Huang ............. G11B 20/10046
360/65
2014/0303913 A1* 10/2014 Neti ....................... G01R 31/34
702/58
2016/0369777 A1* 12/2016 Chiang ................... H02J 3/386

OTHER PUBLICATIONS

Allen, A., et al. "PMU Data Event Detection: A User Guide for Power Engineers." Technical Report NREL/TP-5D00-61664, National Renewable Energy Laboratory (NREL), Oct. 2014.
Allen, Alicia J., et al."Algorithm for Screening PMU Data for Power System Events." 2012 3rd IEEE PES Innovative Smart Grid Technologies Europe (ISGT Europe), Oct. 2012.
Allen, Alicia Jen. "Analysis of Transmission System Events and Behavior using Customer-level Voltage Synchrophasor Data." Dissertation, University of Texas at Austin, May 2013.
Khan, Mukhtaj, et al. "Parallel Detrended Fluctuation Analysis for Fast Event Detection on Massive PMU Data." IEEE Transactions on Smart Grid, vol. 6, Issue: 1, Aug. 2014.
Sohn, Sang-Wook, et al. "Event Detection Method for the PMUs Synchrophasor Data." 2012 IEEE Power Electronics and Machines in Wind Applications, Jul. 2012.
Tate, Joseph Euzebe. "Event Detection and Visualization Based on Phasor Measurement Units for Improved Situational Awareness." Dissertation, University of Illinois at Urbana-Champaign, 2008.

\* cited by examiner

DETECTION OF ELECTRIC POWER SYSTEM ANOMALIES IN STREAMING MEASUREMENTS

RELATED APPLICATION (None)

TECHNICAL FIELD

This disclosure relates to systems and methods for detection of statistically anomalous conditions in a variety of types of systems. More specifically, but not exclusively, the present disclosure relates to analysis of streaming measurement in an electric power generation and distribution systems.

BRIEF DESCRIPTION OF THE DRAWINGS

Non-limiting and non-exhaustive embodiments of the disclosure are described, including various embodiments of the disclosure with reference to the figures included in the detailed description.

DETAILED DESCRIPTION

Figure 1:
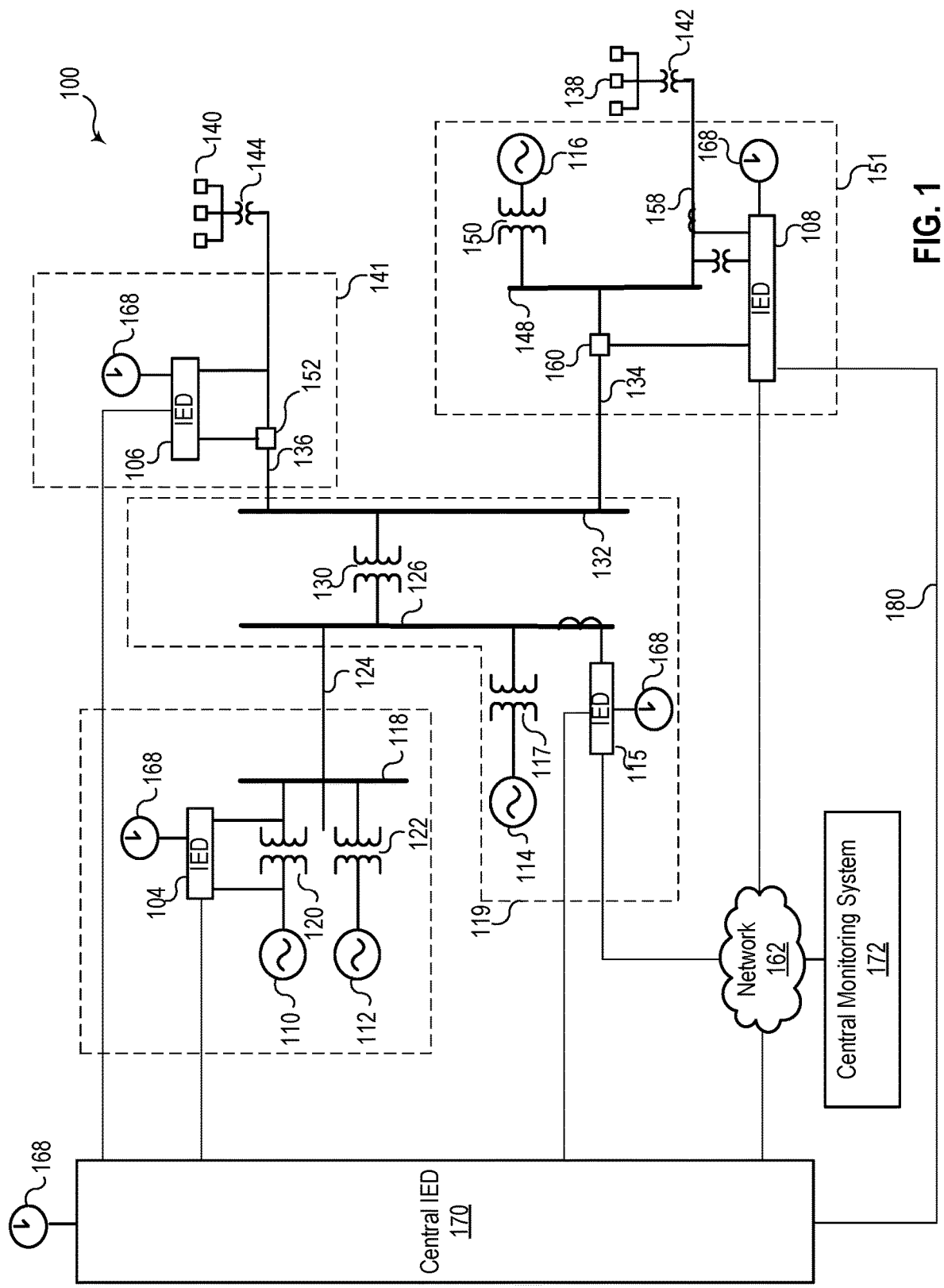
FIG. 1 illustrates a simplified one-line diagram of an electric power transmission and distribution system configured to utilize a communication network consistent with embodiments of the present disclosure.

Modern power systems may include a variety of technologies configured to monitor a variety of electrical and physical parameters. Such monitoring systems may provide a wealth of information regarding the health and operation of systems. Normally, these measurements are uniform and behave in a consistent manner through time. Areas of interest in these measurements, for instance possibly indicating that a mechanical system is failing, are thus far between. The volume of these data can be overwhelming to operators. Automating identification of such events may be useful for operators of electrical power systems engaging in post-event analysis and/or for detection of real-time events.

Various embodiments consistent with the present disclosure may utilize a variety of techniques to analyze streaming data and identify anomalies. In various embodiments, analysis consistent with the present disclosure may be applied to a variety of parameters in an electric power system, such as frequency, voltage, current, power angle, real power, reactive power, complex power, apparent power, power factor, etc. Still further, the techniques disclosed herein may also be utilized in other applications beyond electric power systems. For example, the techniques disclosed herein may be used to monitor equipment temperature, vibration sensor data, harmonic distortion, and other parameters in a variety of systems.

In various embodiments, an anomaly detector may include decomposition of raw streaming measurements to identify statistically anomalous behavior and to determine information related to the anomalous behavior (e.g., grouping of anomalies by similarities in magnitude, temporal proximity, physical proximity, severity, etc.). Anomalies may be compiled and presented to operators in the form of alerts or reports, or the anomalies may be flagged for additional analysis. Still further, in some embodiments, control actions may be implemented based on an anomalous condition.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power transmission and distribution system 100 consistent with embodiments of the present disclosure. Electric power delivery system 100 may be configured to generate, transmit, and distribute electric energy to loads.

Electric power delivery systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160), busses (e.g., busses 118, 126, 132, and 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout system 100. Utilizing a common or universal time source may ensure that IEDs have a synchronized time signal that can be used to generate time synchronized data, such as synchrophasors. In various embodiments, IEDs 104, 106, 108, 115, and 170 may receive a common time signal 168. The time signal may be distributed in system 100 using a communications network 162 or using a common time source, such as a Global Navigation Satellite System ("GNSS"), or the like.

According to various embodiments, central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

In various embodiments, IEDs 104, 106, 108, 115, and 170 may be configured to monitor the frequency of alternating current waveforms in system 100. The measurements may be used in connection with the systems and methods disclosed herein for control of system 100. The IEDs may utilize common time source 168 to time-align measurements for comparison across system 100.

Network 162 may be used to transmit information among various components in system 100, including IEDs 108, 115, 170, and central monitoring system 172. In various embodiments, network 162 may be configured to provide streaming measurements that may be analyzed consistent with the present disclosure to detect anomalies. For example, IED 104 may be configured to monitor generator 110 and to create a stream of synchrophasor measurement reflecting electrical conditions associated with generator 110. The central IED 170 may be configured to analyze the stream of measurements to detect an anomaly associated with generator 110. As discussed in greater detail below, the measurements may be transferred into the frequency domain and categorized into various ranges by frequency. Anomalous conditions associated with generator 110 may be associated with specific frequency ranges. For example, anomalies in the frequency range of approximately 0.15 to 1.00 Hz may indicate an issue associated with the governor of generator 110. Other frequency ranges may correspond to other types of equipment within system 100. For example, anomalies in the frequency range from approximately 5 Hz to approximately 14 Hz may indicate an issue associated with switching electronics that are commonly used to connect solar and wind generators to an electrical power distribution system.

Figure 2:
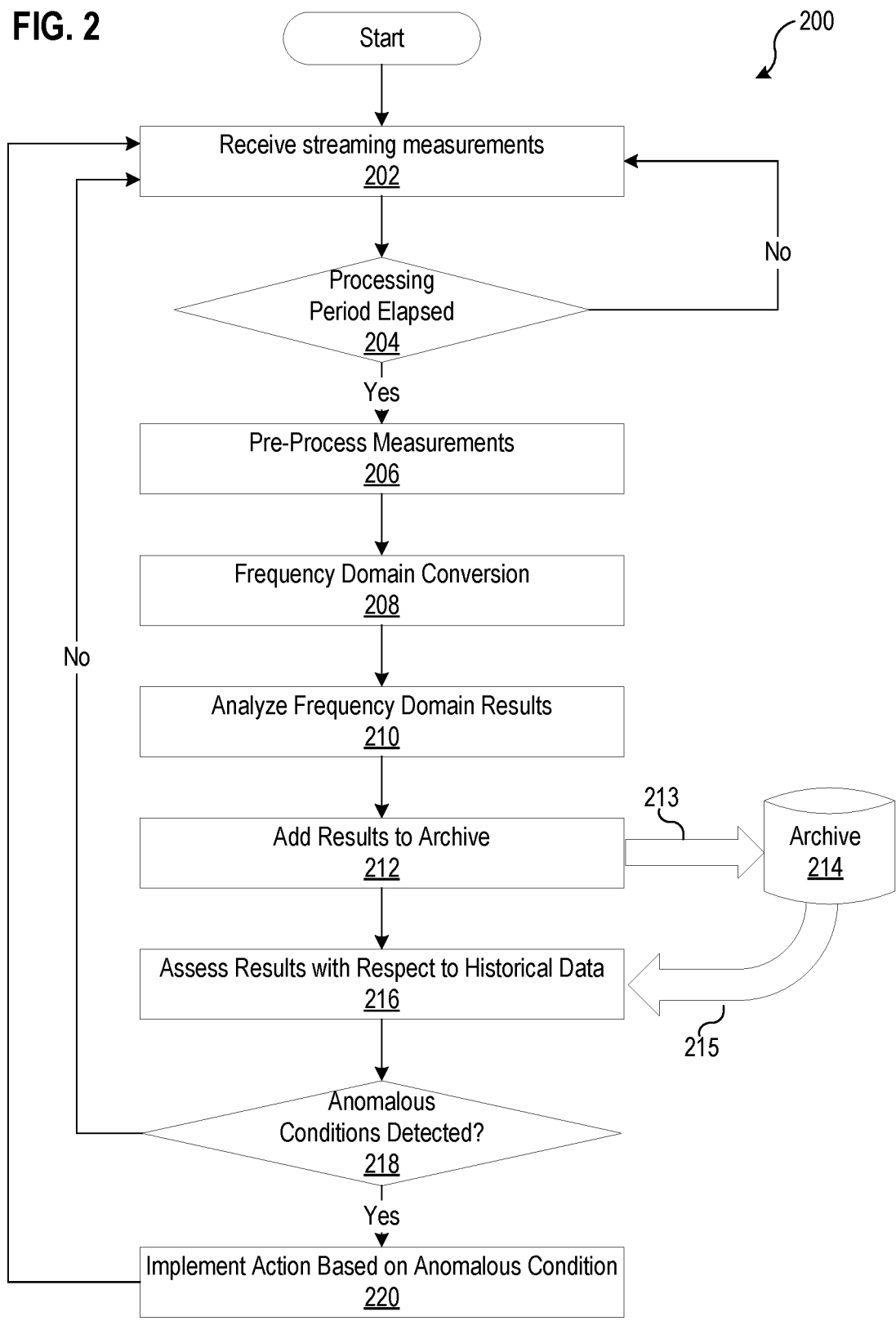
FIG. 2 illustrates a flow chart of one embodiment of a method for detection of electric power system anomalies in streaming measurements consistent with embodiments of the present disclosure.

FIG. 2 illustrates a flow chart of one embodiment of a method 200 for detecting anomalies in electric power generation and distribution systems using statistically anomalous conditions consistent with embodiments of the present disclosure. At 202, streaming measurements may be received. In various embodiments, the streaming measurements may be created by one device and transmitted to another device for analysis. In other embodiments, the streaming measurements may be created and analyzed by the same device.

At 204, method 200 may determine whether a time increment has elapsed for processing a set of measurements. In some embodiments, the specific time window may be a setting controlled by the user. In one specific example, the data may be analyzed every 0.5 seconds. In this example, a specific window of data (e.g., measurements received in the preceding 10 seconds) may be analyzed. Of course, in other embodiments, the interval may be greater than or less than 0.5 seconds, and the window of the data analyzed may be greater than or less than 10 seconds.

At 206, the measurements may be pre-processed in various embodiments. Pre-processing may include various preparations for analysis of the streaming measurements. For example, any missing values in the signal data may be interpolated. Further, the measurements may be conditioned by removing the mean and thereby focusing on oscillatory behavior. The mean may be removed from each data window using to Eq. 1.

$$\bar{x} = \frac{1}{N}\sum_{i=1}^{N} x_i \qquad \text{Eq. 1}$$

Where,

N is the sample length, and $\bar{x}$ is the sample mean.

In some embodiments, linear or polynomial fit routines may be used; however, both techniques may introduce distortion. In other embodiments, differentiation of the signal may also be utilized to remove the mean; however, this approach may attenuate low frequencies (e.g., may act as a high pass filter).

At 208, the signal may be converted to the frequency domain. In some embodiments, the signal may be converted to the frequency domain using a Fourier transformation. The transformation to the frequency domain may represent the energy associated with various frequencies. In some embodiments, the transformation to the frequency domain may be performed using a wavelet transformation. In various embodiments, a frequency domain transformation may be performed for each data window created at 206. Although the particular embodiment illustration in FIG. 2 pertains to monitoring of frequency, in other embodiments, alternative or additional electrical parameters may also be utilized. Such parameters may include, for example, voltage, frequency, power angle, magnitude, complex value, real power, reactive power, complex power, apparent power, power factor, equipment temperature, vibration sensor data, harmonic distortion, etc.

At 210, frequency domain results may be analyzed. The frequency content may be evaluated as a complex number, as the magnitude of the complex number, as the squared magnitude, etc. The frequency content information may be collected into summary various ranges. For example, frequency content over a range of frequencies can be summed (either weighted or unweighted) to provide a summary of the energy in that frequency range. This allows for analysis of frequencies of interest, and also splits out areas of higher energy from those with lower energy. For example, in an electrical power generation and distribution system a large amount of energy in the range or 0-0.15 Hz is associated with generation dispatch. In one specific embodiment using 60 Hz measurements is as follows: 0 Hz-0.15 Hz, 0.15 Hz-1.0 Hz, 1.0 Hz-5.0 Hz, 5.0 Hz-14.0 Hz, and 14.0 Hz-30.0 Hz. In various embodiments, anomalies in a specific frequency range may likely correspond to a particular issue in the electric power system. Table 1 identifies the particular issues or systems likely affected by anomalies in each specific frequency range.

TABLE 1

| Low Freq. Range | High Freq. Range | System/Issue Affected |
|---|---|---|
| 0 | 0.15 | Automatic Generator Control and Redispatch |
| 0.15 | 1.0 | Generator Governor Control |
| 1.0 | 5.0 | Small Generators, Electronic Loads |
| 5.0 | 14.0 | Switching Electronics |

Table 2 identifies frequency ranges associated with various types of oscillations. The oscillations listed in Table 2 are in the sub-harmonic range. Similar disturbances may also exist in the harmonic and connected EMI ranges. In various embodiments, a data stream sampled at 1 MHz may be triggered on high frequency Impulses, sags, swells, damped oscillations, and undamped oscillations.

TABLE 2

| Low Freq. Range | High Freq. Range | Type of Oscillation |
|---|---|---|
| 0.1 | 1 | Interarea mode oscillations |
| 1 | 2 | Local plant mode oscillations |
| 2 | 3 | Intraplant mode oscillations |
| 10 | 46 | Torsional mode oscillations |

At 212, information relating to analysis of the frequency domain results may be collected and stored in archive 214, as indicated by arrow 213. The collection of information in archive 214 may enable method 200 to determine, among other things, statistical information relating to measurements of an electrical power system over time. The information stored in archive 214 may be used by method 200 to determine when conditions are anomalous. In various embodiments, archive 214 may include statistical measurements in addition to or in lieu of actual measurements. In some embodiments, data that is identified as anomalous may be excluded from archive 214. The exclusion of anomalous data may reduce the possibility of skewing the criteria to which new data is compared. Various techniques may be used to determine whether data is added to archive 214, such as use of a threshold or an evaluation of deviation from an expected value. In some embodiments, archive 214 may contain a temporally limited history of previous values. For example, archive 214 may be configured to store a fixed number of samples or a fixed period of samples (e.g., 1 hour of samples, 1 day of samples, etc.).

The use of historical and/or statistical metrics generated by a particular system may enable method 200 to determine expected operating ranges for a given system without requiring an operator to specify such operating ranges. Rather, method 200 may detect deviations from normal operating ranges by detecting measurements or events that deviate in a statistically significant amount from the conditions reflected by historical measurements. As such, system 200 may adapt to systems having a variety of normal operating ranges.

At 216, the results may be assessed with respect to historical data from archive 214, as indicated by arrow 215. In some embodiments, the results may be normalized to facilitate comparison of the results and historical data. The results may be normalized or assess in a variety of ways and utilizing a variety of techniques. For example, measured data in a particular window may be normalized using various statistical methods. The normalized value may be referred to herein as the z-ratio. Possible normalizing techniques include the statistical Standard Score (also known as Z-score or Z-value) and Modified Z-score among others. The Standard Score of an observation may be determined using Eq. 2

$$Z_i = \frac{x_i - \bar{x}}{s} \quad \text{Eq. 2}$$

Where,
$\bar{x}$ represents the sample mean, and
s represents the sample standard deviation.
The Modified Z-score may be determined using Eq. 3.

$$M_i = \frac{0.6745(x_i - \tilde{x})}{\text{median}(|x_i - \tilde{x}|)} \quad \text{Eq. 3}$$

Where,
$\tilde{x}$ represents the median of the data, and
$|\tilde{x}|$ represents the absolute value of $\tilde{x}$.

The thresholds can be compared individually or as a mathematical computation involving a combination of values. For example, the results may be compared to data from a previous day, a weighted average from a previous week, a continuously calculated series, etc. In various embodiments, the assessment of the results may span over one or more periods of time. In various embodiments, the assessment of the results may span over one or more periods of time.

Further, in some embodiments, the periods of time may be combined in different ways. For example, in one embodiment in which data is compared on a daily basis, the historical value may reflect an hourly value, or an average value of the full day.

In various embodiments, events that overlap in time and/or geographic proximity and/or frequency range(s) can be consolidated into a single event. Multiple signals with the same time or closely time aligned anomalies may be gathered during post processing in order to show which signals saw the same event. Comparison of event strength with various forms of proximity (e.g., physical proximity, electrical proximity) may allow approximation of the anomaly origin. In one specific embodiment, two forms of time consolidation are performed. One first consolidates signaled events within a defined time of each other. The second feeds the z-ratio into a defined length finite impulse response (FIR) averaging filter and the threshold is then compared against the FIR output. The FIR filter may disregard single window or very short events, but also provides for smoothing out sporadic events into a longer event duration.

At 218, method 200 may determine whether the results reflect anomalous conditions. One or more normalized values and/or raw data values may be compared against thresholds to identify anomalous conditions. In various embodiments, the threshold may need to be exceeded for a fixed time, the amount over the threshold may be integrated to identify a trigger value, the average over a configured time period could be compared to a threshold, etc. In various embodiments, the thresholds may be specified using information from the archive 214. For example, a condition may be deemed anomalous if it falls outside of a third standard deviation. Such a threshold would identify data approximately 0.3% of the streaming data measurements for heightened review and/or for evaluation of potential control actions to address the anomalous conditions. As noted above, the volume of data generated by streaming power system measurements can be overwhelming to operators. As such, automated identification of anomalous conditions may help operators to quickly identify data points relating to such conditions for purposes of real-time mitigation of such events and/or post-event analysis.

At 220, an action may be implemented based on the anomalous conditions. In various embodiments, actions may include identifying certain data for heightened review, providing notification to an operator, or implementing one or more control actions configured to affect conditions in the electric power. The particular action implemented at 220 may be determined based on a variety of factors. Such factors, may include the severity of the anomaly, the type of the anomaly, the duration of the anomaly, etc. In various embodiments, a report may comprise a display on an operator in an electrical power system control center, a text message, an email message, a telephone call, etc. Further, a control action may comprise selectively connecting or disconnecting a portion of the electrical system, increasing generation, decreasing load, etc.

Figure 3A:
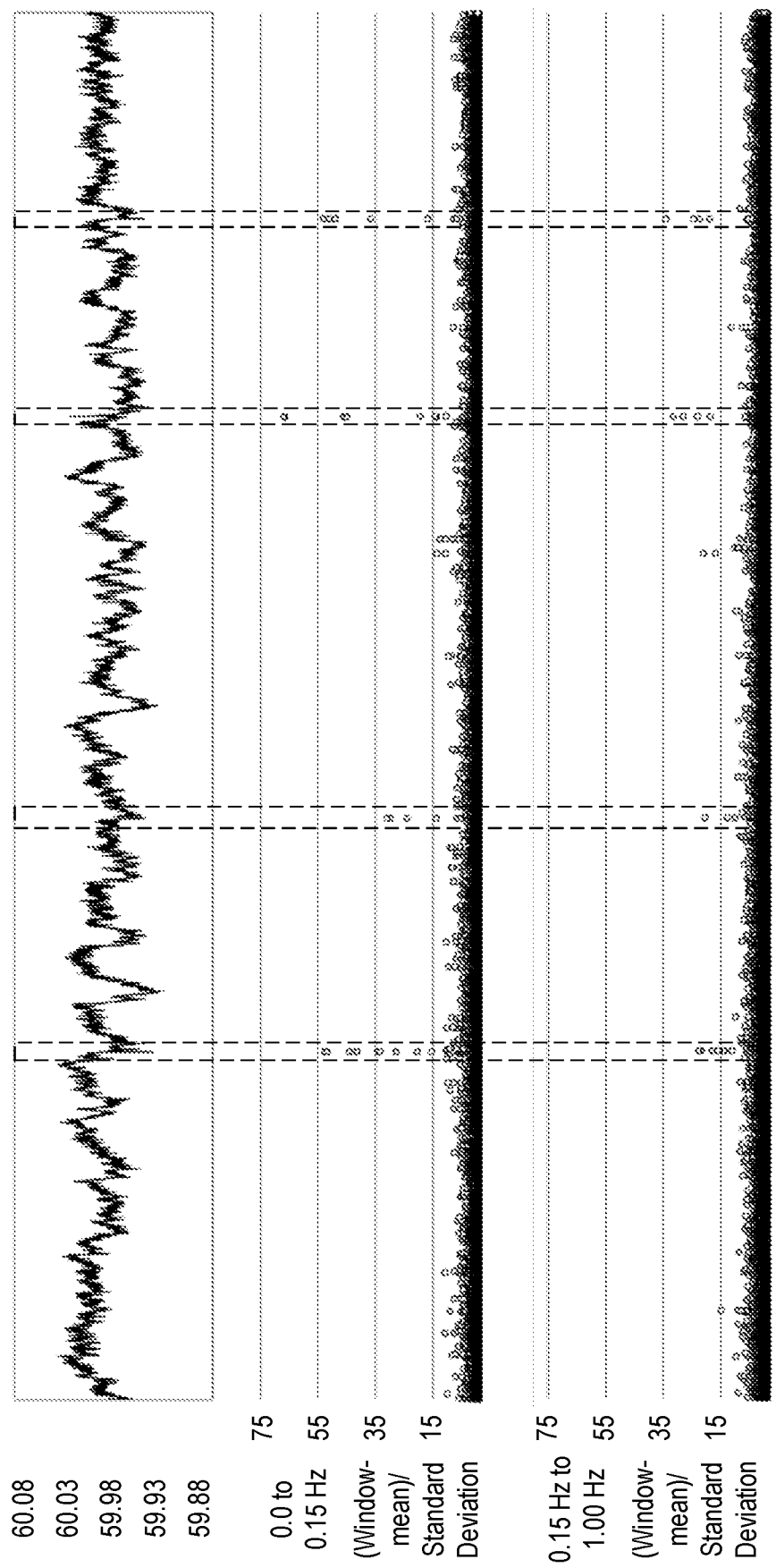
FIG. 3A illustrates plots over time showing the frequency of an electric power system, together with a plurality of normalized frequency measurement values in two distinct frequency ranges consistent with embodiments of the present disclosure.

FIG. 3A illustrates plots over time showing the frequency of an electric power system, together with a plurality of normalized frequency measurement values in two distinct frequency ranges consistent with embodiments of the present disclosure. The specifically illustrated frequency ranges in FIG. 3A are 0.0 Hz to 0.15 Hz and 0.15 Hz to 1.00 Hz. At four specific times, each of which is highlighted by a dashed box, the normalized value spikes. Each of these points corresponds to a significant and rapid change in frequency. The largest spikes are found in the 0.0 Hz to 0.15 Hz range. As noted above, this range may correspond to automatic generator control and redispatch within the electrical power system. As such, an operator of the electrical power system assessing the data illustrated in FIG. 3A, may evaluate the automatic generator control and redispatch system.

In certain embodiments, a threshold may be specified for various embodiments consistent with the present disclosure, a threshold may be established that is used to identify anomalous conditions. In the illustrated embodiment, a threshold (e.g., a value of 15) may be established based on y-axis value to indicate anomalous conditions. A system may be configured to perform various actions in response to detection of an anomalous condition, such as notifying an operator, tagging specific data values, and/or grouping anomalies by similarities in frequency, time locality, physical locality, severity, and/or electrical signal proximity. Data that is tagged as anomalous may be subjected to additional analysis, segregated from other data, subject to different retention parameters, etc.

Figure 3B:
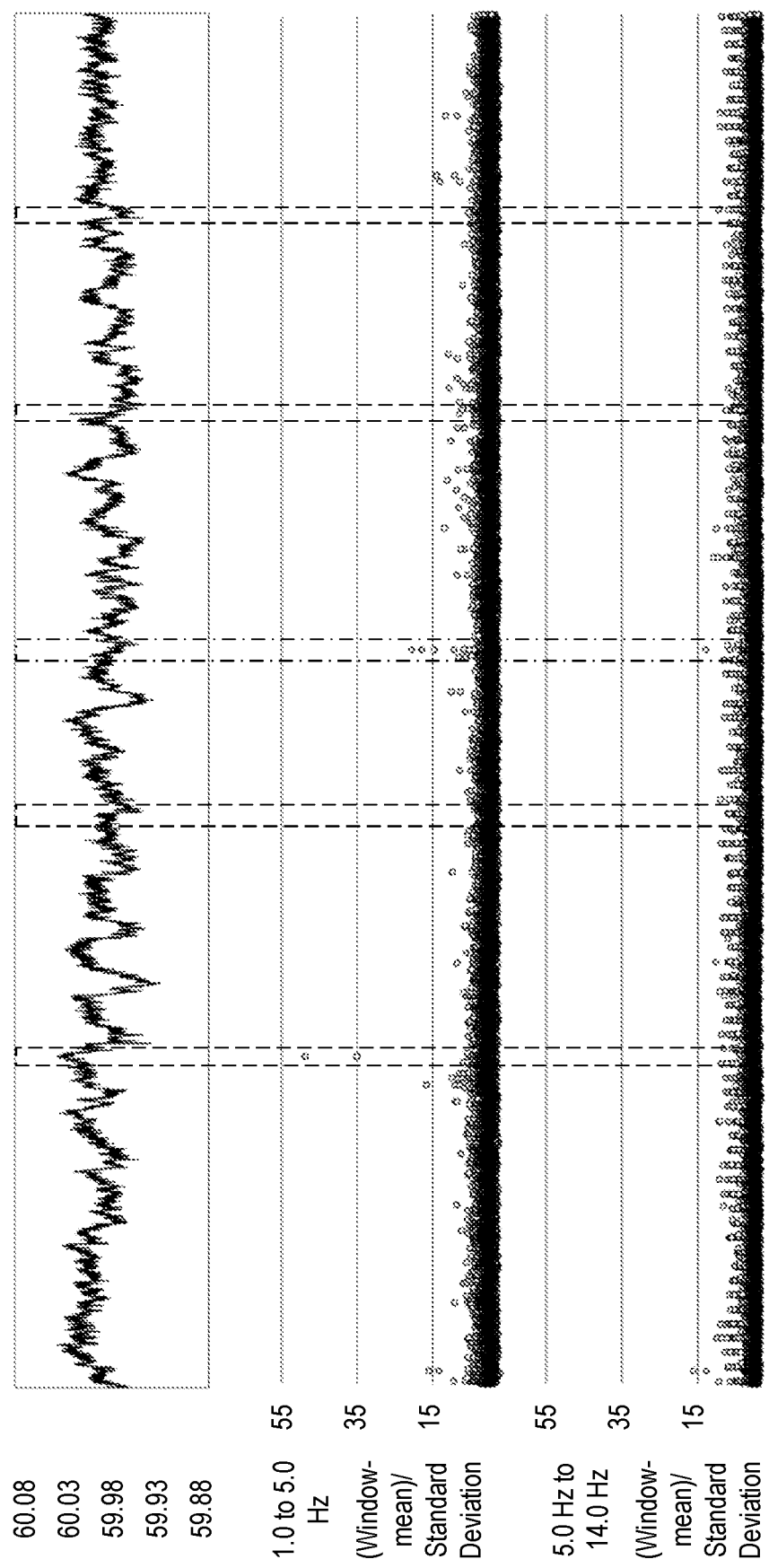
FIG. 3B illustrates plots over time showing the frequency of an electric power system, together with a plurality of normalized frequency measurement values in two additional distinct frequency ranges consistent with embodiments of the present disclosure.

FIG. 3B illustrates plots over time showing the frequency of an electric power system, together with a plurality of normalized frequency measurement values in two additional distinct frequency ranges consistent with embodiments of the present disclosure. The specifically illustrated frequency ranges in FIG. 3B are 1.0 Hz to 5.0 Hz and 5.0 Hz to 14.0 Hz. The four specific times corresponding to spikes in FIG. 3A are also shown. Three of the four specific times do not show spikes in the frequency ranges shown in FIG. 3B. The presence of spikes in certain frequency ranges that are not shown in other frequency ranges may aid in evaluating the root cause of the deviations. For example, in the plots shown in FIGS. 3A and 3B, there are no spikes in the range of 5.0 Hz to 14.0 Hz. As such, an operator may conclude that the frequency deviations are not associated with switching electronics.

FIG. 3B also illustrates a spike, which is highlighted by a box with a dash-dot pattern, that is not reflected in any other frequency ranges. As indicated in Table 1, the frequency range of 1.0 to 5.0 may correspond to small generators and/or electronic loads within the electric power system. Comparison of the spikes in various frequency ranges as shown in FIGS. 3A and 3B may provide useful information to differentiate between multiple potential causes of an anomaly.

Although FIGS. 3A and 3B specifically illustrate measurements of frequency, similar techniques may be used for other parameters. For example, in an electric power system, other electrical parameters such as voltage, current, real power, reactive power, complex power, apparent power, power factor, etc. As discussed above, the analysis illustrated in FIGS. 3A and 3B may also be applied outside of electrical power systems. For example, the same techniques may be applied to identify vibration in a system or to identify anomalous temperature readings in a system.

Figure 4:
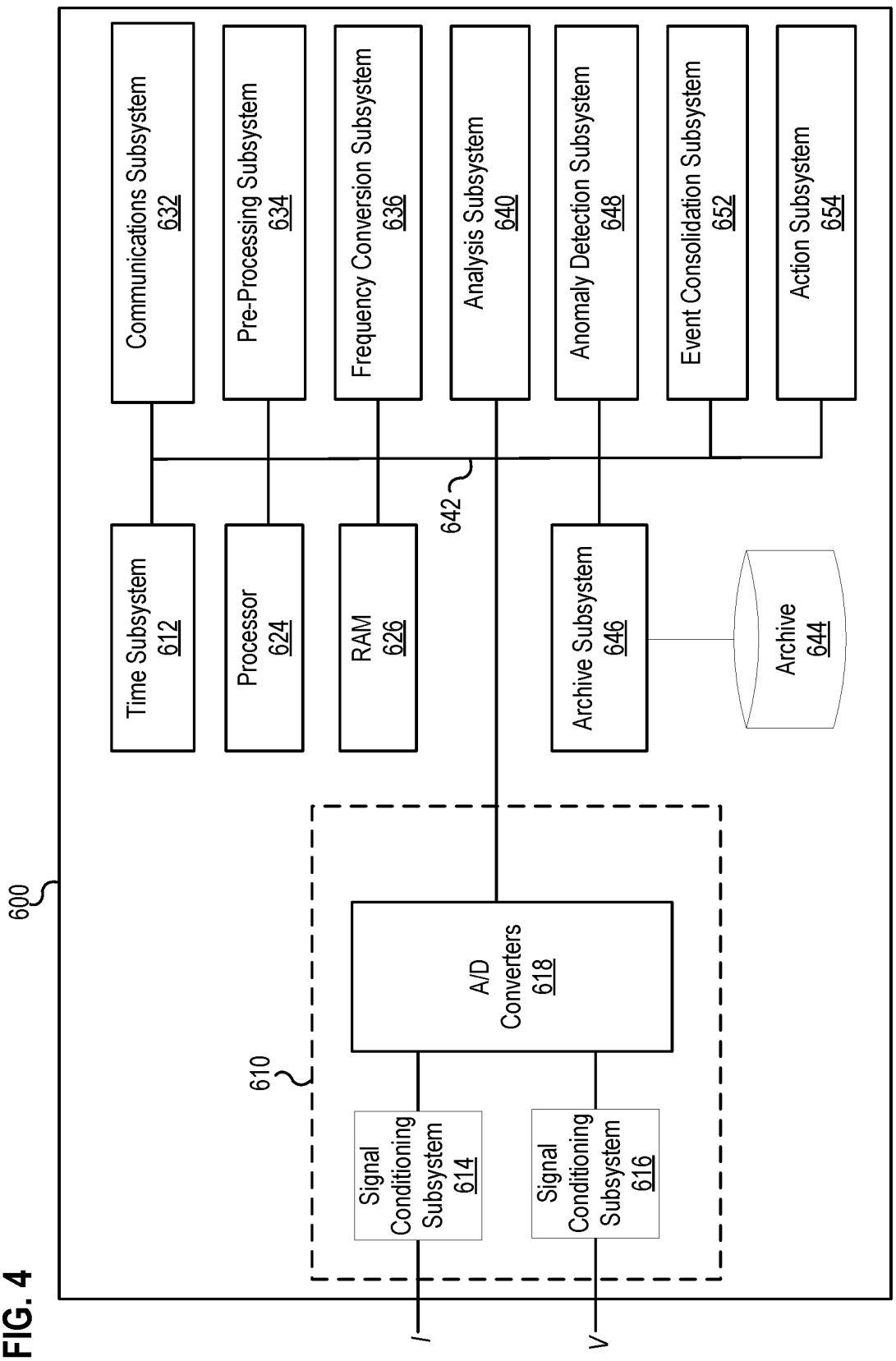
FIG. 4 illustrates a block diagram of a system configured to detect electric power system anomalies in streaming measurements consistent with embodiments of the present disclosure.

FIG. 4 illustrates a functional block diagram of a system 600 configured to detect anomalies in streaming measurements consistent with embodiments of the present disclosure. In some embodiments, system 600 may be implemented using hardware, software, firmware, and/or any combination thereof. Moreover, certain components or functions described herein may be associated with other devices or performed by other devices. The specifically illustrated configuration is merely representative of one embodiment consistent with the present disclosure. A data bus 642 may facilitate communication among various components of distributed controller 600.

System 600 includes a communications subsystem 632 configured to communicate with other devices (not shown), such as sources of streaming measurements to be analyzed by system 600. System 600 may further include a time subsystem 612, which may be used to receive a time signal (e.g., a common time reference) allowing distributed controller 600 to associate data with a time-stamp received from time system 612. In certain embodiments, a common time signal may be received via communications subsystem 632. One such embodiment may employ the IEEE 1588 protocol. The IEEE 1588 standard includes hardware-assisted time-stamps, which allow for time accuracy in the nanosecond range. Such precision may be sufficient for applications requiring high fidelity time sources (e.g., the sampling of the sinusoidal currents and voltages on power lines to calculate synchrophasors).

Processor 624 may be configured to process communications received via communications subsystem 632, time subsystem 612, and to coordinate the operation of the other components of distributed controller 600. Processor 624 may operate using any number of processing rates and architectures. Processor 624 may be configured to perform any of the various algorithms and calculations described herein. Processor 624 may be embodied as a general purpose integrated circuit, an application specific integrated circuit, a field-programmable gate array, and/or any other suitable programmable logic device. Instructions to be executed by processor 624 may be stored in random access memory 626 (RAM).

In certain embodiments, system 600 may include a sensor component 610. In the illustrated embodiment, sensor component 610 is configured to gather data directly from equipment such as a conductor in an electric power distribution system. The sensor component 610 may include signal conditioning subsystems 614, 616 that are configured to condition the signal for use by system 600. In some embodiments, the signal conditioning subsystems 614, 616 may include transformers configured to step down a voltage or current to a suitable level for use by system 600 or filters configured to limit the bandwidth of signals. Sensor component 610 may further include A/D converters 618 that may sample and/or digitize conditioned waveforms to form corresponding digitized signals. The digitized signals may be provided to data bus 642 and accessed by other components of system 600. In one specific embodiment, the data gathered by sensor component 610 may be used to generate synchrophasor measurements that represent electrical conditions in an electric power system.

A pre-processing subsystem 634 may be configured to prepare a signal for analysis. In some embodiments, any data values in the signal may be interpolated or estimated using other techniques. Further, the pre-processing subsystem 634 may remove the mean from the signal. As described above, mean removal may be accomplished in several ways in various embodiments. Pre-processing subsystem 634 may further apply various filters to the signal. In some embodiments, such filters may include high-pass or low pass filters, a differentiator, an integrator, and the like. Pre-processing subsystem 634 may further apply a window function, such as a Hanning window function, a Hamming window function, a Blackman window function, or a window Cosine function. The window functions may be configured to reduce an edge effect when converting a signal to the frequency domain.

A frequency conversion subsystem 636 may be configured to convert a signal to the frequency domain. In embodiments configured to analyze frequency, the conversion to the frequency domain may be accomplished using a Fourier Transform or a Wavelet analysis. In embodiments in which signals outside of the frequency domain are analyzed, the frequency conversion subsystem 636 may be omitted.

An analysis subsystem 640 may be configured to assess the signal. In various embodiments, analyzed measurements, such as particular data windows, may be grouped into specific frequency ranges. FIGS. 3A and 3B provide one example of one such grouping. In other embodiments, values may be grouped based on other characteristics. In some embodiments, the analysis subsystem may be configured to normalize the values of the data using historical information obtained from an archive 644.

An archive subsystem 646 may be configured to determine various parameters associated with a data stream analyzed by system 600. Archive subsystem 646 may further be configured to store such parameters in an archive 644. In various embodiments, statistical values associated with a data stream may be stored in archive 644.

An anomaly detection subsystem 648 may be configured to identify anomalous values in a data stream. Raw values, normalized values, or a combination of raw and normalized values may be compared against various thresholds by anomaly detection subsystem 648 to identify anomalous values. The thresholds can be compared individually or as a mathematical computation involving a combination of values. In some embodiments, anomaly detection subsystem 648 may require that a threshold be exceeded for a particular duration, may require that the threshold be exceeded by a particular amount, or that the amount over the threshold be integrated to identify an anomalous condition.

An event consolidation subsystem 652 may be configured to consolidate events that overlap in time, geography, and/or frequency into a single event. Multiple signals with the same time or closely time aligned anomalies may be grouped to identified which signals reflect the same event. Comparison of event strength with various forms of proximity (physical, electrical) shows may allow system 600 to approximate the origin of the anomaly origin. In one specific embodiment, event consolidation subsystem 652 may be configured to input the z-ratio of a particular value into a defined length FIR averaging filter. The threshold may then be compared against the FIR output. The FIR filter serves to disregard single window or very short events, but also provides for smoothing out sporadic events into a longer event duration.

An action subsystem 654 may be configured to implement an action based on an anomalous condition. In various embodiments action subsystem 654 may be configured to alert an operator to the detection of an anomalous condition. An alert may be sent to an operator in a variety of ways, including displaying a message on a screen or generating an electronic message (e.g., an email message or a text message). Further, under some conditions, a control action may be implemented based on the anomalous condition. For example, where the anomalous condition pertains to an under-frequency condition in an electric power distribution system, action subsystem 654 may be configured to generate a control action to reduce electrical load to stabilize the frequency. In another example, where the anomalous condition pertains to an over-current condition in an electric power distribution system, action subsystem 654 may be configured to generate a control action to open a breaker to eliminate the over-current condition. In yet another example, where the where the anomalous condition pertains to a high impedance fault in an electric power distribution system, action subsystem 654 may be configured to de-energize the faulted power line. Various techniques disclosed in U.S. Pat. No. 9,160,158, may be utilized in connection with the present disclosure for the identification of such faults.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system configured to identify an anomaly in a stream of measurements, the system comprising:
a communications interface configured to receive a stream of measurements representing electrical conditions within a portion of an electrical power system;
an archive subsystem configured to maintain a data archive comprising a statistical representation of the stream of measurements;
a pre-processing subsystem configured to divide the stream of measurements into a plurality of data windows;
a frequency conversion subsystem configured to transform each of the plurality of data windows to a plurality of frequency domain representations;
an analysis subsystem configured to:
normalize the plurality of frequency domain representations based on the data archive;
group the normalized plurality of frequency domain representations into a plurality of sub-harmonic frequency ranges; and
an anomaly detection subsystem configured to:
perform a comparison of the normalized plurality of frequency domain representations to at least one threshold and to determine that the comparison indicates an anomalous condition;
an action subsystem configured to provide a report to a display of an electronic device based on the anomalous condition to alert an operator to detection of the anomalous condition.

2. The system of claim 1, wherein the action subsystem is configured to modify the electric power system.

3. The system of claim 1, wherein the report comprises an indication of the anomalous condition.

4. The system of claim 1, wherein the archive subsystem is further configured to add the normalized plurality of frequency domain representations to the data archive.

5. The system of claim 1, wherein the normalized plurality of frequency domain representation comprises a z-ratio of one of the plurality of data windows to a distribution represented in the data archive.

6. The system of claim 1, wherein the stream of measurements comprises a stream of synchrophaser data.

7. The system of claim 1, further comprising an event consolidation subsystem configured to:
detect a plurality of anomalous data windows from among the plurality of data windows; and
associate each of the plurality of anomalous data windows with the anomalous condition.

8. The system of claim 6, wherein the event consolidation subsystem is further configured to associate the plurality of anomalous data windows based on one of a temporal proximity, a physical proximity, and a severity of the plurality of anomalous data windows.

9. The system of claim 1, wherein the anomaly detection subsystem comprises a finite impulse response filter configured to generate an average of the normalized frequency domain representations and to perform the comparison based on the average.

10. A method for identifying an anomaly in a stream of measurements, the method comprising:
receiving a stream of measurements representing electrical conditions within a portion of an electrical power system;
generating a data archive comprising a statistical representation of the stream of measurements;
dividing the stream of measurements into a plurality of data windows;
transforming each of the plurality of data windows to a plurality of frequency domain representations;
generating a normalized plurality of frequency domain representations based on the data archive;
grouping the normalized plurality of frequency domain representations into a plurality of sub-harmonic frequency ranges;
performing a comparison of the normalized plurality of frequency domain representations to at least one threshold;
determining that the comparison indicates an anomalous condition;
providing a report to a display of an electronic device based on the anomalous condition to alert an operator to detection of the anomalous condition.

11. The method of claim 10, further comprising modifying the electrical power system.

12. The method of claim 10, wherein the report comprises an indication of the anomalous condition.

13. The method of claim 10, further comprising:
adding the plurality of normalized frequency domain representations to the data archive.

14. The method of claim 10, wherein the normalized frequency domain representation comprises a z-ratio of one of the plurality of data windows to a distribution represented in the data archive.

15. The method of claim 10, further comprising:
   detecting a plurality of anomalous data windows from among the plurality of data windows; and
   associating each of the plurality of anomalous data windows with the anomalous condition.

16. The method of claim 15, wherein the plurality of anomalous data windows are associated based on one of a temporal proximity, a physical proximity, and a severity of the plurality of anomalous data windows.

17. The method of claim 10, wherein the plurality of frequency ranges is selected to correspond to an issue in the electric power system.

18. The method of claim 10, further comprising generating an average of the normalized frequency domain representations using a finite impulse response filter; and
   wherein the comparison is based on the average.

19. A system configured to identify an anomaly in a stream of measurements, the system comprising:
   a communications interface configured to receive a stream of measurements;
   an archive subsystem configured to maintain a data archive comprising a statistical representation of the stream of measurements;
   a pre-processing subsystem configured to divide the stream of measurements into a plurality of data windows;
   an analysis subsystem configured to:
      generate a normalized plurality of representations based on the plurality of data windows and the data archive;
      group the normalized plurality of representations into a plurality of sub-harmonic ranges; and
   an anomaly detection subsystem configured to:
      perform a comparison of the plurality of normalized representations to at least one threshold and to determine that the comparison indicates an anomalous condition;
   an action subsystem configured to provide a report to a display of an electronic device based on the anomalous condition to alert an operator to detection of the anomalous condition.

20. A system of claim 19, wherein the stream of measurements represents one of a voltage, a current, a power factor, a temperature, and a vibration.

* * * * *